United States Patent [19]
Zavracky

[11] Patent Number: 6,091,125
[45] Date of Patent: Jul. 18, 2000

[54] MICROMECHANICAL ELECTRONIC DEVICE

[75] Inventor: Paul M. Zavracky, Norwood, Mass.

[73] Assignee: Northeastern University, Boston, Mass.

[21] Appl. No.: 09/204,517

[22] Filed: Dec. 2, 1998

[51] Int. Cl.[7] .................................................. H01L 29/82
[52] U.S. Cl. .......................................... 257/417; 257/415
[58] Field of Search ..................................... 257/415, 417

[56] References Cited

U.S. PATENT DOCUMENTS

| | | |
|---|---|---|
| 4,906,586 | 3/1990 | Blackburn . |
| 5,103,279 | 4/1992 | Gutteridge . |
| 5,243,861 | 9/1993 | Kloeck et al. . |
| 5,453,628 | 9/1995 | Hartsell et al. . |
| 5,604,313 | 2/1997 | Cahill et al. . |
| 5,659,195 | 8/1997 | Kaiser et al. . |
| 5,808,331 | 9/1998 | Zhang et al. . |

FOREIGN PATENT DOCUMENTS 138023  4/1985  European Pat. Off. .

*Primary Examiner*—Stephen D. Meier
*Attorney, Agent, or Firm*—Weingarten, Schurgin, Gagnebin & Hayes LLP

[57] ABSTRACT

The present invention is an active micromechanical electronic device of extremely small physical size, such that the device can take advantage of the quantum-mechanical phenomenon of electron tunneling. The device is produced using Scanning Electron Microscope (SEM) electron beam lithography. In operation, the gap between the tip of the beam and the drain contact is small enough (typically tens of angstroms) that electron tunneling occurs across the gap between the tip of the beam and the drain contact occurs, with the amount of resulting electron flow dependent on the width of the gap between the tip and the drain contact. The device acts as a controlled current source whose output is dependent on the mechanical position of the beam tip with respect to the drain contact. The tip to drain spacing varies due to the electrostatic force presented between the beam and the gate contact.

16 Claims, 3 Drawing Sheets

MICROMECHANICAL ELECTRONIC DEVICE

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

Micromechanical switches are known in the art. The basic structure of a micromechanical switch includes a source contact, a drain contact, and a gate contact. A conductive bridge or beam structure is attached at one end to the source contact. The bridge structure overhangs the gate contact and the drain contact and is capable of coming into mechanical and electrical contact with the drain contact when deflected downward by an electrostatic force developed between the bridge and the gate contact. Once the bridge is in contact with the drain contact, the bridge permits current to flow from the source contact to the drain contact. The voltage on the gate controls the actuation of the device by generating an electrostatic field in the space between the bridge and the gate contact.

Switches of this type are disclosed in U.S. Pat. No. 4,674,180 to Zavracky et al., the whole of which is incorporated by reference herein. In this device, a specific threshold voltage is required to deflect the bridge structure so that it may contact the drain contact. Once the bridge comes into contact with the drain contact, current flow is established between the source and the drain.

The micromechanical devices typically have a length of 60 microns and a bridge tip to drain contact spacing of two microns. These micromechanical devices are either in the "ion" condition wherein electrical communication has been established between the source and the drain, or "off" wherein there is no electrical communication between the source and the drain. It would be desirable to have a micromechanical device which functions as an active micromechanical electronic device which provides a variable output dependent upon the level of an input.

BRIEF SUMMARY OF THE INVENTION

The present invention is a micromechanical electronic device configured such that the device can take advantage of the quantum-mechanical phenomenon of electron tunneling. The device is produced using Scanning Electron Microscope (SEM) electron beam lithography. In operation, the gap between the tip of the beam and the drain contact is small enough (typically tens of angstroms) that electron tunneling occurs across the gap between the tip of the beam and the drain contact, with the amount of resulting electron flow dependent on the width of the gap between the tip and the drain contact. The device acts as a controlled current source whose output is dependent on the mechanical position of the beam tip with respect to the drain contact. The tip to drain spacing varies due to the electrostatic force presented between the beam and the gate contact.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

Figure 1A:
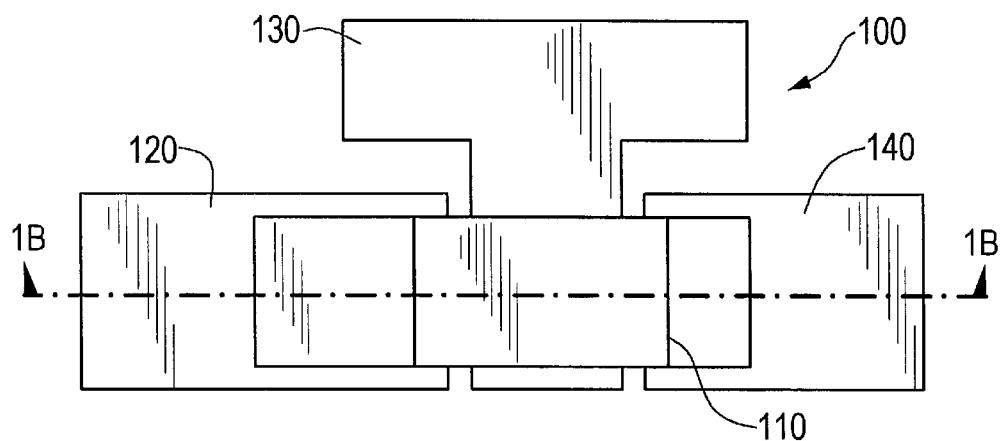
FIG. 1A is a top view of a micromechanical switch of the present invention.
Figure 1B:
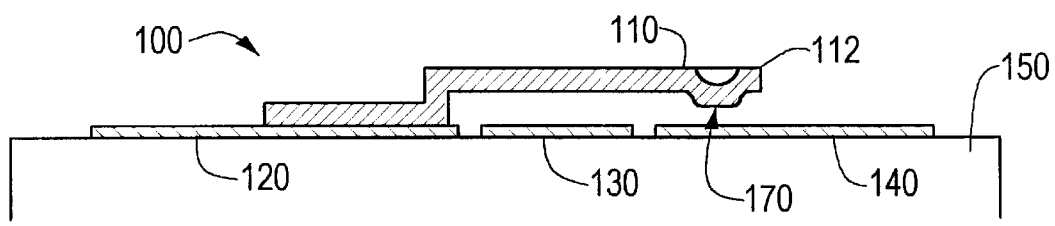
FIG. 1B is a side view of the micromechanical switch shown in FIG. 1A cut along line AA'.

A micromechanical electronic device is presented. Referring to FIGS. 1A and 1B, a first embodiment of the device 100 is shown. The micromechanical electronic device 100 includes a deflectable beam 110, a source contact 120, a gate contact 130 and a drain contact 140 mounted on a substrate 150.

The size of the device of the present invention is an important parameter that correlates to the device performing as an active micromechanical electronic device. The beam length according to the invention is in the range of approximately 4 micrometers, the beam width is approximately 3 micrometers and the beam thickness is approximately 0.1 micrometer. The beam includes a tip 170 at a distal end 112, and the tip 170 is positioned tens of angstroms from the drain contact 140.

In a preferred embodiment the substrate material of the micromechanical device of the present invention comprises glass, though other embodiments may comprise silicon or other substrate material known in the electrical arts. The beam material in this embodiment is preferably nickel. However other platable materials such as gold, chromium, copper and/or iron may also be used. The source contact 120, gate contact 130, and drain contact 140 may be any conductive metal, such as platinum, palladium, ruthenium, gold, or other conductive metal known in the art.

Figure 2:
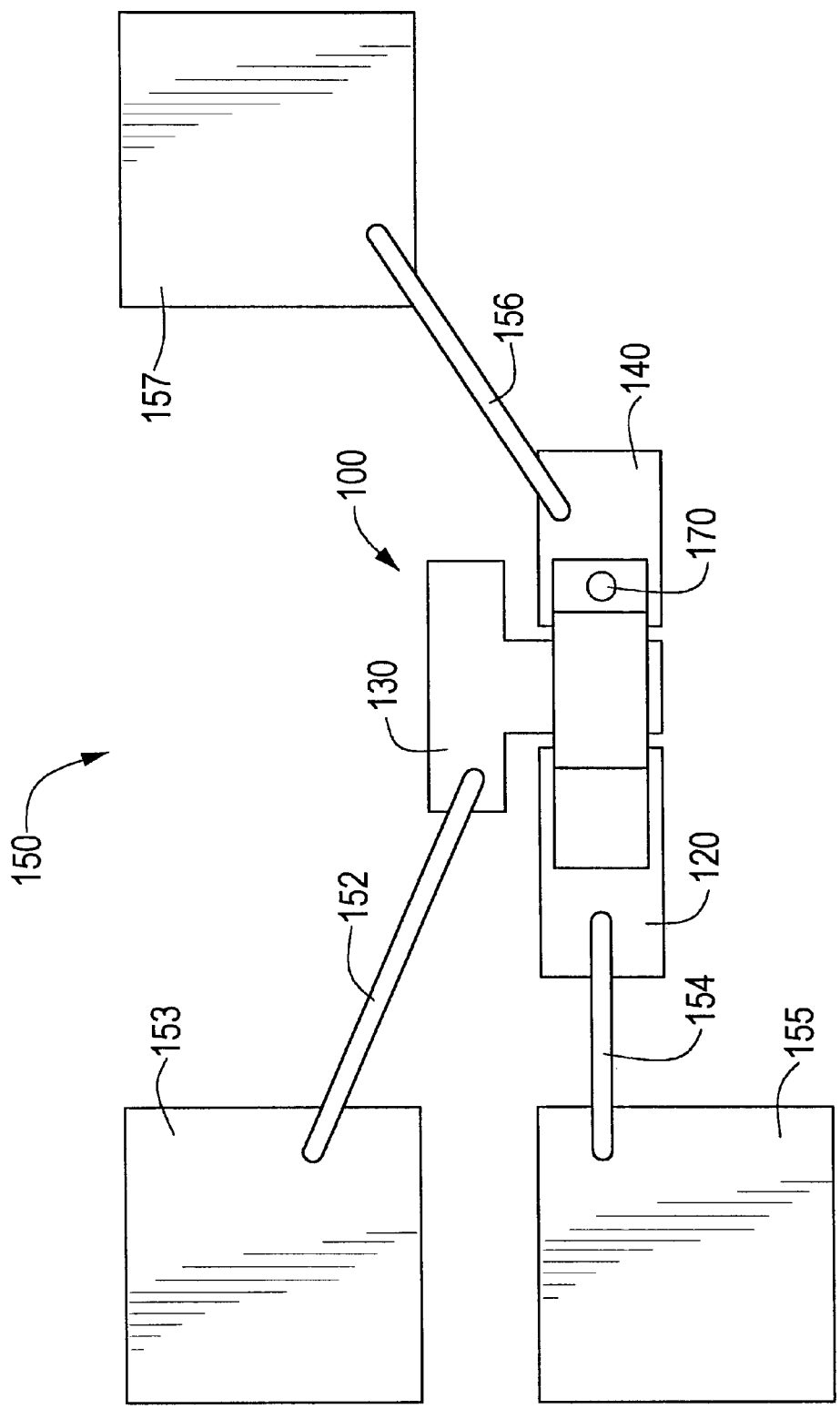
FIG. 2 is a diagram of the device of FIG. 1 installed in a circuit.

FIG. 2 illustrates a circuit 150 in which the device 100 illustrated in FIGS. 1A and 1B is implemented. The circuit 150 includes bonding pads 153, 155, and 157 which allow bonding wires (typically gold or aluminum) to be bonded to the pads to allow for interconnectivity outside the device 150. Bonding pads 153 and 155 are connected to the device 100 by connections 152 and 154, respectively. Bonding pad 157 is electrically connected to drain contact 140 by connection 156. The bonding pads 153 and 155 supply current for the gate contact 130 and the source contact 120, respectively.

The performance and operation of the device of the present invention is based on the mechanical properties of the beam material; the electrostatic forces generated between the beam and the gate; and the phenomenon of electron tunneling.

The deflection of the beam $v_o$ due to a force W applied at the end of the beam may be expressed by the equation:

$$v_o = \frac{-Wl^3}{3E'I} \quad (1)$$

where:

W is the applied load;

l is the length of the cantilever;

E' is the Effective Young's modulus; and

I is the moment of inertia.

Combining equation (1) with moment of inertia for a rectangular beam gives the following equation for the lumped spring constant of the beam:

$$k = \frac{bh^3 E'}{4l^3} \quad (2)$$

The structure of the beam and the underlying substrate approximate the parallel plates of a capacitor. The force $F_e$ between two parallel plates of a capacitor (ignoring fringing fields) can be expressed as:

$$F_E = \varepsilon_o A \frac{V^2}{2(d-v_o)^2} \quad (3)$$

where:

d is the initial spacing between the electrodes;

$\epsilon_o$ is the permittivity of free space;

A is the area of one of the plates; and

V is the applied voltage.

In the simplest approximation, the force exerted by the electric field is counteracted by the spring force of the beam such that $$kv_o = \varepsilon_o A \frac{V^2}{2[d-v_o]^2}. \quad (4)$$

This leads to the relationship between the voltage and the position of the beam:

$$V = [d - v_o] * \sqrt{2kv_o / \varepsilon_o A}. \quad (5)$$

For small $v_o$, the voltage required to hold the beam in position varies approximately as the square root of the distance. As the position increases, the voltage required to hold the beam increases monotonically, but at an ever decreasing rate. Further increases in the position require less holding voltage. Therefore, if the position were to increase beyond a certain point, at a fixed voltage, the beam would continue to bend until the contact tips at the end of the beam touched the drain. Therefore, for voltages above the maximum voltage threshold value ($V_{th}$) the tips will be in contact with the drain in steady state.

The threshold voltage $V_{th}$ may be expressed as:

$$V_{th} = \frac{2}{3} d * \sqrt{2 \frac{kd}{\varepsilon_o A}}. \quad (6)$$

The example above is for a rectangular beam. However, other more complex beam shapes could be conceived in which the force plate area is increased independently of the spring constant. The gate capacitance and the threshold voltage are intimately coupled just as in a field effect transistor (FET) where the gap spacing which correlates to the gate oxide thickness in an FET. Compared to FETs, the gate capacitance can be 100 to 500-fold smaller, and can be as much as 1000-fold smaller. In this case:

$$V_{th} = \frac{2}{3} d * \sqrt{\frac{2k}{C_{gate}}} \quad (7)$$

The electrostatic force and the spring force are:

$$F_e = \frac{\varepsilon \cdot b \cdot l \cdot V^2}{[2 \cdot (d-v_o)^2]} \quad F_s = k \cdot v_o \quad (8)$$

which gives:

$$k \cdot v = \frac{\varepsilon \cdot b \cdot l \cdot V^2}{[2 \cdot (d-v_o)^2]} \quad (9)$$

For a small displacement calculation for the device of the present invention, the tip is initially within a few tens of angstroms from the drain. This distance is denoted as $t_o$. The gate distance (d) is much larger so that the maximum possible deflection is a small fraction of d.

$$k \cdot v_o = \frac{\varepsilon \cdot b \cdot l \cdot V^2}{\left[2 \cdot d^2 \cdot \left(l - \frac{2 \cdot v_o}{d}\right)\right]} \quad (10)$$

Substituting in Equation 2 and solving for $v_o$ gives:

$$v_o(V_g) = \frac{1}{4}\left[d - \sqrt{d^2 - \frac{16 \epsilon l^4}{h^3 dE'} V g^2}\right] \quad (11)$$

The threshold voltage is calculated by setting $v_o$ equal to the initial spacing at the tip:

$$v_o(V_g = V_t) = t_0$$

Substituting in Equation 4 gives:

$$t_0 = \frac{-1}{(8 \cdot (k \cdot d))}\left(-2 \cdot k \cdot d^2 + 2 \cdot \sqrt{kd} \cdot \sqrt{k \cdot d^3 - 4 \cdot \varepsilon \cdot b \cdot l \cdot V_t^2}\right) \quad (12)$$

Solving for the threshold voltage gives:

$$V_T = \sqrt{\frac{2 \cdot t_o \cdot k}{\varepsilon \cdot b \cdot l}} \cdot d\sqrt{l - 2t_0/d} \quad (13)$$

Operation of the device occurs for gate voltages between $0 \leq V_g < V_t$. The gap (g) between the tip and the drain can be expressed as:

$$g(V_g) = t_0 \cdot v_o(V_g) \quad (14)$$

The tunneling current is calculated as follows:

$$I_d(V_g) = \alpha \cdot V_d \cdot e^{-\beta \cdot g(V_g)}. \quad (15)$$

Substituting equations 11 and 12 in Equation 15 gives:

$$I_d(V_g) = \alpha V_d \cdot e^{\beta\left(\frac{d}{4}-t_0\right)} e^{-\frac{\beta}{4}\sqrt{d^2 - \frac{16\varepsilon14}{h^3 dE'}V_g^2}} \quad (16)$$

An exemplary device made by the Scanning Electron Microscope electron beam lithography features a beam length of 3 µm, a beam width of 1 µm, and a beam-tip to drain spacing of 20 Å.

Figure 3:
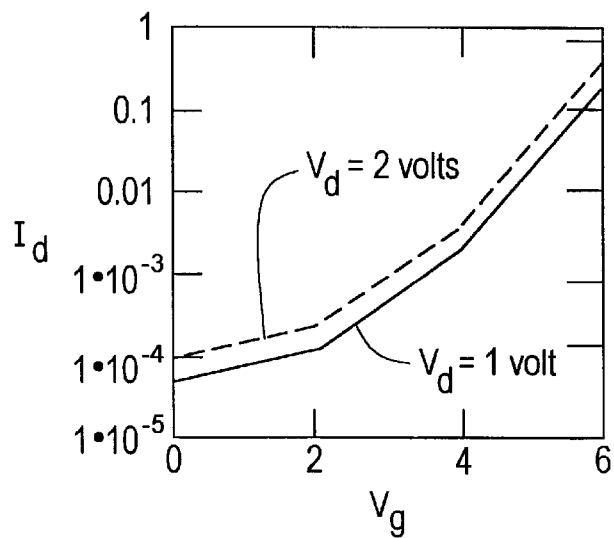
FIG. 3 is a graph of the device with a constant drain voltage.
Figure 4:
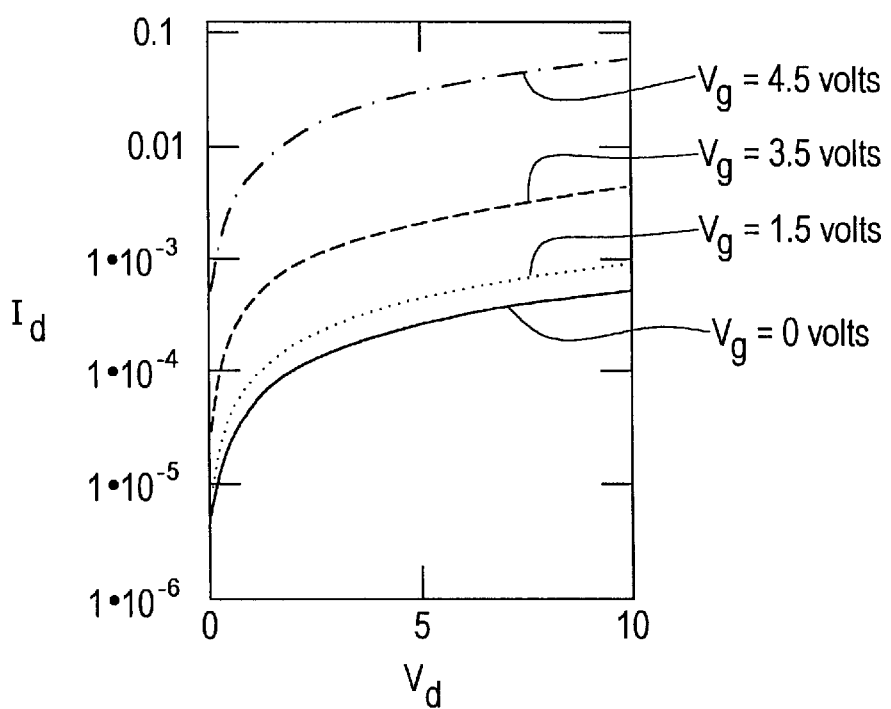
FIG. 4 is a graph of the device with a constant gate voltage.

FIGS. 3 and 4 demonstrate the predicted performance of the device. FIG. 3 shows the tunneling current $I_d$ as a function of the gate voltage $V_g$ for fixed drain voltage $V_d$. The two curves of the figure show $V_d$ set at two levels, $V_d=1$ volt for the lower curve and $V_d=2$ volts for the upper curve. In FIG. 4 the current $I_d$ is plotted against the drain voltage with a constant gate voltage (at four levels).

The present device takes advantage of electron tunneling in order to operate as an active micromechanical electronic device. Electron tunneling is a quantum-mechanical phenomenon in which electrons penetrate an extremely thin barrier in order to produce electron flow. The barrier must be very thin, typically less than one hundred angstroms, and the thinner the barrier, the greater the tunneling of electrons. In the present invention, the barrier is the gap existing between the tip of the beam and the drain contact. Thus, when the beam is deflected the tip to drain gap changes and a corresponding change in tunneling current occurs. The tunneling current can be precisely controlled by controlling the electrostatic field between the beam and the gate electrode.

The device of the present invention has broad uses. For example, the micromechanical electronic device of the invention may be used as a variable resistor, a constant current source or as part of a voltage controlled oscillator circuit. An advantage the electromechanical electronic device has over semiconductor devices is the micromechanical electronic device never saturates.

Although the invention has been shown and described with respect to an illustrative embodiment thereof, it should be appreciated that the foregoing and various other changes, omissions, and additions in the form and detail thereof may be made without departing from the spirit and scope of the invention as delineated in the claims.

I claim:

1. An active micromechanical electronic device comprising:
   a substrate;
   a source contact mounted on said substrate;
   a drain contact mounted on said substrate;
   a gate contact mounted on said substrate; and
   a beam having a first end, a central portion and a second end, wherein the first end of said beam is attached to said source contact, the central portion of said beam is disposed over said gate contact, and the second end of said beam is disposed over said drain contact such that said second end is at a distance from said drain contact such that electron tunneling from said beam to said drain contact occurs.

2. The device of claim 1 wherein the distance from said beam to said drain contact is less than approximately one hundred angstroms.

3. The device of claim 1 wherein the distance from said beam to said drain contact is approximately twenty angstroms.

4. The device of claim 1 wherein said device functions as a tunneling tip device wherein the distance between said beam and said drain electrode is dependent on the mechanical positioning of said beam due to an electrostatic field established between said beam and said gate electrode, said device operative to provide an output dependent on the mechanical position of the second end of said beam with respect to said drain contact.

5. The device of claim 1 wherein said beam has a length of less than five micrometers.

6. The device of claim 1 wherein said beam has a length of approximately three micrometers.

7. The device of claim 1 wherein said beam has a width of less than two micrometers.

8. The device of claim 1 wherein said beam has a width of approximately one micrometer.

9. The device of claim 1 wherein said beam has a thickness of approximately 0.1 micrometer.

10. The device of claim 1 wherein said substrate comprises glass.

11. The device of claim 1 wherein said substrate comprises silicon.

12. The device of claim 1 wherein said beam comprises nickel.

13. The device of claim 1 wherein said beam comprises a material selected from the group consisting of gold, chromium, copper and iron.

14. The device of claim 1 wherein said source contact, said drain contact and said gate contact comprise platinum.

15. The device of claim 1 wherein said source contact, said drain contact and said gate contact comprise a material selected from the group consisting of palladium, ruthenium, and gold.

16. The device of claim 1, wherein said device is formed by scanning electron microscope electron beam lithography.

* * * * *